(12) United States Patent
Horan et al.

(10) Patent No.: US 6,512,407 B2
(45) Date of Patent: Jan. 28, 2003

(54) METHOD AND APPARATUS FOR LEVEL SHIFTING APPROACH WITH SYMMETRICAL RESULTING WAVEFORM

(75) Inventors: John M. Horan, Cork; Niall O'Donovan, Leap, both of (IE)

(73) Assignee: Parthus Ireland Limited, Dublin (IE)

(*) Notice: Subject to any disclaimer, the term of this patent is extended or adjusted under 35 U.S.C. 154(b) by 0 days.

(21) Appl. No.: 09/893,946

(22) Filed: Jun. 27, 2001

(65) Prior Publication Data

US 2002/0145461 A1 Oct. 10, 2002

Related U.S. Application Data

(60) Provisional application No. 60/282,213, filed on Apr. 5, 2001.

(51) Int. Cl.[7] .................................................. H03L 5/00
(52) U.S. Cl. ........................................................ 327/333
(58) Field of Search .................... 326/80, 81; 327/108, 327/109, 110, 111, 112, 291, 292, 293, 295, 296, 318, 319, 333

(56) References Cited

U.S. PATENT DOCUMENTS

| 5,113,097 A | * | 5/1992 | Lee ............................. 257/351 |
| 5,896,045 A | * | 4/1999 | Siegel et al. ................... 326/81 |
| 6,072,333 A | * | 6/2000 | Tsukagoshi et al. .......... 326/26 |

* cited by examiner

Primary Examiner—Jeffrey Zweizig
(74) Attorney, Agent, or Firm—Blakely, Sokoloff, Taylor & Zafman, LLP

(57) ABSTRACT

A method is described that level shifts a differential signal to produce a first signal and level shifts the logical inverse of the differential signal to produce a second signal that is the logical inverse of the first signal. The method then inverts the first signal and inverts the second signal. The method then inverts the first signal and the inverted second signal together and inverts the second signal and the inverted first signal together.

14 Claims, 6 Drawing Sheets

METHOD AND APPARATUS FOR LEVEL SHIFTING APPROACH WITH SYMMETRICAL RESULTING WAVEFORM

CLAIM FOR PRIORITY OF EARLIER FILING DATE

The present application hereby claims the benefit of a U.S. Provisional Application filed on Apr. 5, 2001 and provided Application No. 60/282,213.

FIELD OF THE INVENTION

The field of invention relates to signal processing generally; and, more specifically, to a method and apparatus for a level shifter with a symmetrical output waveform.

BACKGROUND

FIG. 1a shows an embodiment of a differential to single ended level shifter 101. A level shifter 101 changes an electronic signal's voltage level(s). Differential to single ended means the input signal is differential and the output signal is single ended. FIG. 1b shows an embodiment of a transistor level design for the level shifter 101 of FIG. 1a. FIG. 1c shows an exemplary differential input signal (IN+, IN−) 102c, 103c and an exemplary single ended output signal (LS OUT)104c for the level shifter embodiment 101 of FIG. 1b.

As observed with respect to the exemplary waveforms of FIG. 1c, the level shifter 101 output signal 104c provides the same logical information as the differential input signal 102c, 103c (IN+, IN−) but with different voltage levels. That is, the input signals 102c and 103c (IN+ and IN−) swing over a voltage range of "A" volts while the output signal 104c (LS OUT), in response, swings over a voltage range of "Vcc" volts–where Vcc>A (noting that GND corresponds to 0.0 volts).

Different voltage swings (as between the input and output signals) correspond to the changing or "shifting" of at least one input voltage level to a new output voltage level. The particular level shifter 101 that is shown in FIGS. 1a and 1b (and whose operation is demonstrated in FIG. 1c) may be referred to as a "rail-to-rail" level shifter because the output signal 104c (LS OUT) swings between the shifter's supply rails of Vcc and GND. Rail-to-rail level shifters are often used for changing the levels of an electronic signal to better conform to those expected by digital circuitry (e.g., that is coupled to output 104a,b).

A problem with differential to single ended level shifters (including those of the rail-to-rail type) is the lack of symmetry between the rise times and fall times of the output signal waveform 104c (LS OUT). For example, referring to the exemplary output signal waveform 104c of FIG. 1c, note that the signal rise time T1 is less than the signal fall time T2. The asymmetry between rise and fall times arises from the asymmetry in the design of the level shifter.

That is, the conversion of a differential signal into a single ended signal involves asymmetrical processing. For example, referring to the exemplary transistor level embodiment of FIG. 1b and the exemplary waveforms 102c, 103c and 104c of FIG. 1c, note that a logic low IN− 103c signal value corresponds to logic high LS OUT 104c signal value of Vcc. According to the design of FIG. 1b, the above described relationship between IN− and LS OUT is achieved by transistor Q2. Specifically, when IN− is a logic low Q2 turns "on" which, in turn, effectively shorts the output node 104b to the Vcc rail.

Note also that a logic low IN+ 102c signal value corresponds to a logic low LS OUT 104c signal value. According to the design of FIG. 1b, the above described relationship between IN+ and LS OUT is achieved by transistors Q1, Q3 and Q4. Specifically, when IN+ is a logic low Q1 turns "on" which results in the driving of current through Q3. The driving of current through Q3 raises the drain-to-source voltage across Q3 which, correspondingly, also raises the gate voltage on Q4. Raising the gate voltage on Q4 eventually turns "on" Q4 which, in turn, effectively shorts the output node 104b to the GND rail.

Comparing the dynamics of how the output voltage rails of Vcc or GND are formed at the level shifter output node 104b, note that one transistor (Q2) is mostly involved with the raising of the output 104b LS OUT voltage to Vcc; while three transistors (Q1, Q3, Q4) are mostly involved with the lowering of the output 104 LS OUT voltage to GND. Because less transistors are involved with the raising of the output 104b LS OUT voltage than its lowering, the output 104b LS OUT voltage rises faster than it falls.

Hence, as mentioned above, the rise time T1 of the output signal waveform 104c LS OUT (of FIG. 1c) is less than its fall time T2. Problems may arise if a signal having an asymmetry (such as the level shifter output signal 104c LS OUT having the aforementioned difference between its rise and fall times) is processed or otherwise used. For example, data may be incorrectly interpreted.

BRIEF DESCRIPTION OF THE DRAWINGS

The present invention is illustrated by way of example, and not limitation, in the Figures of the accompanying drawings in which:

FIG. 1b shows an embodiment of a transistor level design for the level shifter of FIG. 1a;

FIG. 2a shows a differential to single ended level shifting approach having improved rise and fall times as compared to the level shifter of FIG. 1a;

FIG. 2b shows an embodiment of a transistor level design for the level shifting approach of FIG. 2a;

FIG. 3a shows a differential to differential level shifting approach having rise and fall times that are comparable to the level shifting approach of FIG. 2a;

FIG. 3b shows an embodiment of a transistor level design for the level shifting approach of FIG. 3a;

FIG. 4a shows a differential to differential level shifting approach having less duty cycle distortion and rise/fall time misalignment as compared to the level shifting approach of FIG. 3a;

FIG. 4b shows an embodiment of a transistor level design for the level shifting approach of FIG. 4a;

DETAILED DESCRIPTION

As described in the background, problems may arise if a signal having an asymmetry (such as the level shifter output signal 104c LS OUT of FIG. 1c having a difference between its rise and fall times) is processed or otherwise used. The following discussion will develop an approach for an improved level shifter that provides a symmetrical output signal. The improved approach will be demonstrated by first discussing the effect of some modifications that may be made to the basic level shifter of FIGS. 1a through 1c.

Figure 1C:
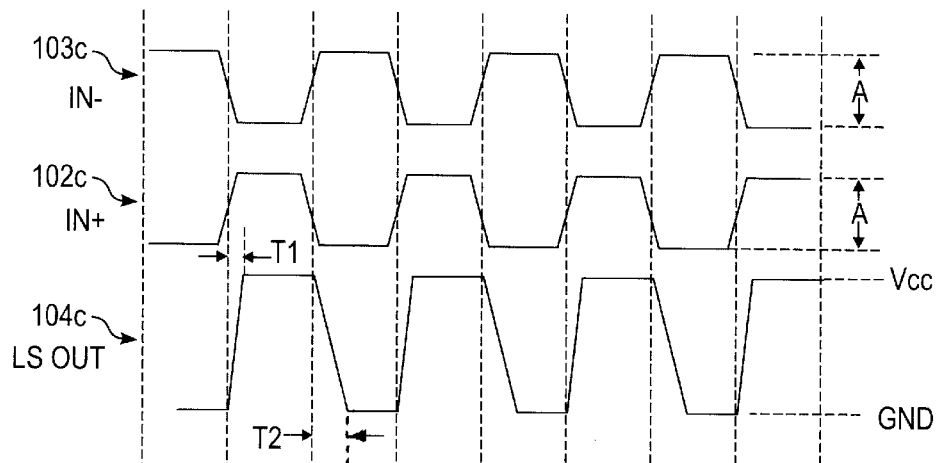
FIG. 1c shows exemplary input and output signal waveforms for the level shifter embodiment of FIG. 1b.
Figure 2A:
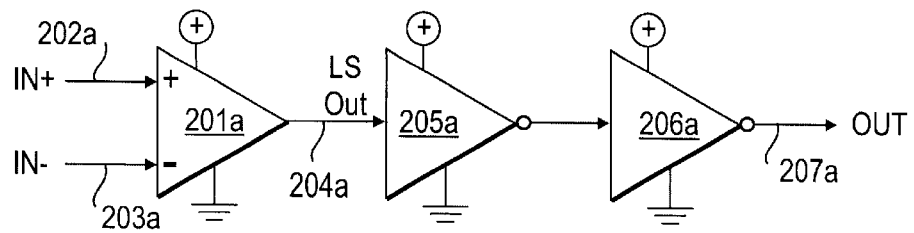
Figure 2B:
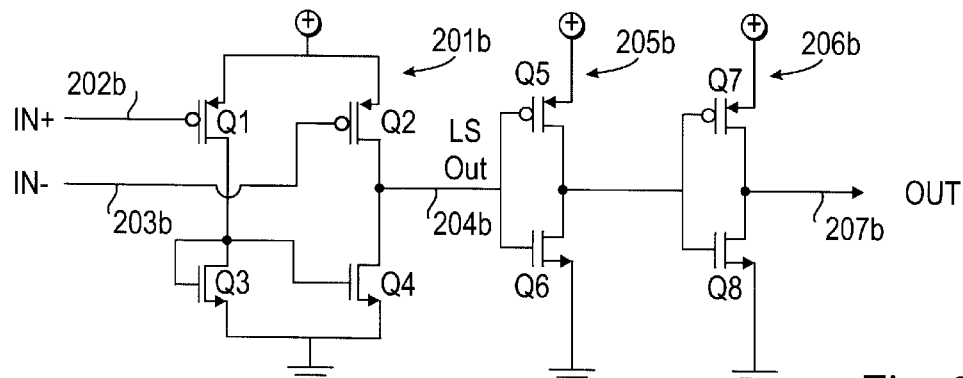
Figure 2C:
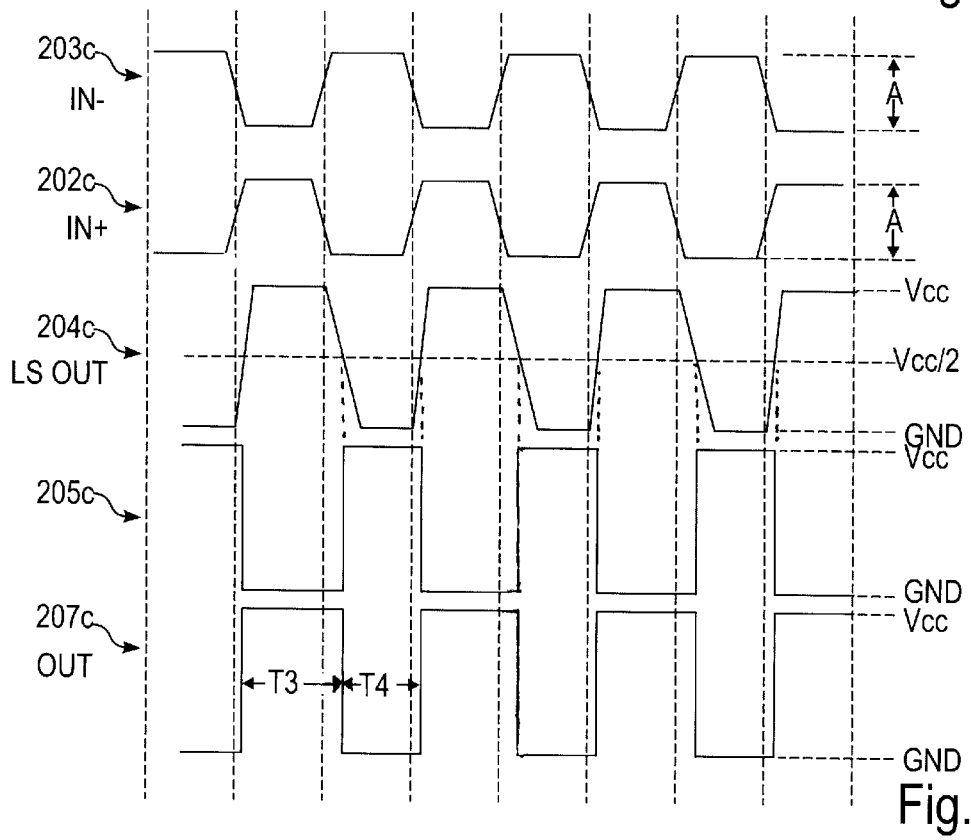
FIG. 2c shows exemplary input and output signal waveforms for the level shifting embodiment of FIG. 2b.

For example, FIGS. 2a through 2c relate to a technique that may be used to reduce the rise and fall times of the level shifter output signal. That is, comparing the level shifter output signal 104c LS OUT of FIG. 1c with the output signal 207c OUT of FIG. 2c, note that the rise and falls times of signal 207c are substantially less than the rise and fall times T1 and T2 of signal 104c. The reduction in rise and fall times, referring to FIG. 2a, are obtained by the introduction of a pair of cascade inverters 205a and 206a that follow the differential-to-single ended to level shifter 201a (as described in more detail below).

Figure 1A:
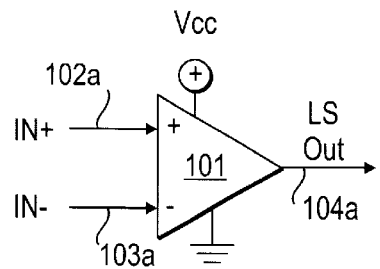
FIG. 1a shows a differential to single ended level shifter.
Figure 1B:
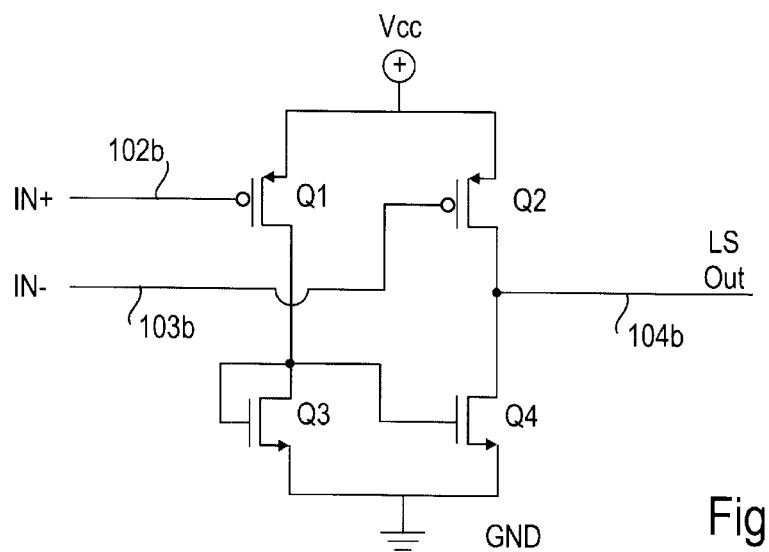

For simplicity, in one embodiment, the differential-to-single ended level shifter 201a of FIG. 2a may be viewed as corresponding to the differential-to-single ended level shifter 101a of FIG. 1a. As such, referring to FIGS. 2c and 1c, the IN+ signal 202c, IN− signal 203c and LS OUT signal 204c of FIG. 2c correspond to the IN+ signal 102c, IN− signal 103c and LS OUT signal 104c of FIG. 1c. Note that the aforementioned asymmetry between the rise and fall times of the LS OUT signal 204c are observed in FIG. 2c.

The first inverter 205a provides the logical inverse of the LS OUT signal 204c. That is, if the LS OUT signal 204c corresponds to a logical "high", the first inverter 205a will present a logical "low"; and, if the LS OUT signal 204c corresponds to a logical "low", the first inverter 205a will present a logical "high". The decision made by the first inverter 205a (as to whether to not the LS OUT signal 204c corresponds to a logical high or logical low) may be effectively made against a threshold level.

For example, with respect to the particular embodiment of FIGS. 2b and 2c, the decision made by the first inverter 205 is effectively made against a threshold level of Vcc/2 (which is drawn super-imposed upon the LS OUT signal 204c of FIG. 2c). As such, as observed from the first inverter output signal 205c, if the LS OUT signal 204c rises above Vcc/2 the first inverter 205a provides a logical "low"; and, if the LS OUT signal 204c falls below Vcc/2, the first inverter 205a provides a logical "high".

Recall from above that the level shifter architecture of FIG. 2a allows for an output signal OUT 207c having smaller rise and fall times than the level shifter output signal LS OUT 104c of FIG. 1c. The rise and fall times of the first inverter output signal 205c may be made small by designing the first inverter 205a,b to supply enough current to rapidly charge the parasitic capacitance(s) and inductance(s) that reside between the first 205a, 205b and second 206a, 206b inverters.

FIG. 2b corresponds to an embodiment of a transistor level design for the level shifting approach of FIG. 2a. Referring to FIG. 2b, note that a higher transistor gain corresponds to larger transistor current magnitude (e.g., where transistor gain corresponds to transistor transconductance as measured by output IDS current per input VGS voltage). As such, in order to achieve small rise and fall times at the first inverter 205a, 205b output, the transistors Q5 and Q6 that drive the first inverter 205b output may be designed with a larger gain (e.g., transconductance) than that associated with the transistors Q2 and Q4 within the level shifter 201a,b.

The second inverter 206a,b provides the logical inverse of the first inverter output signal 205c; and, in so doing, effectively provides the logical values originally presented by the level shifter output signal 204c. That is, the logical inversion provided by the first inverter 205a,b is effectively reversed so that the output signal OUT 207c corresponds to a level shifted version of the non inverted input signal IN+ 202c.

The small rise and fall times achieved with the first inverter 205a,b may be rippled through to the output signal OUT 207c of the second inverter 206a,b by designing the transistors Q7 and Q8 of the second inverter 206a,b with high transconductance as described above. In alternate embodiments, only the second inverter 206a,b (or only the first inverter 205a,b) is designed with transistors having large transconductance.

Note that, if the rise and fall times of the output signal OUT 207c are designed to be small and an asymmetry exists as between the rise and fall times of the level shifter output signal 204c LS OUT (as observed in FIG. 2c), the output signal 207c has duty cycle distortion. That is, within output signal OUT 207c, the width T3 of a logical high value is noticeably different than the width T4 of a logical low value. In a sense, the asymmetry as between the rise and fall times T1, T2 of the level shifter output signal 204c LS OUT is converted into an asymmetry as between the logical high and logical low widths T3, T4 of the output signal 207c OUT.

Figure 3A:
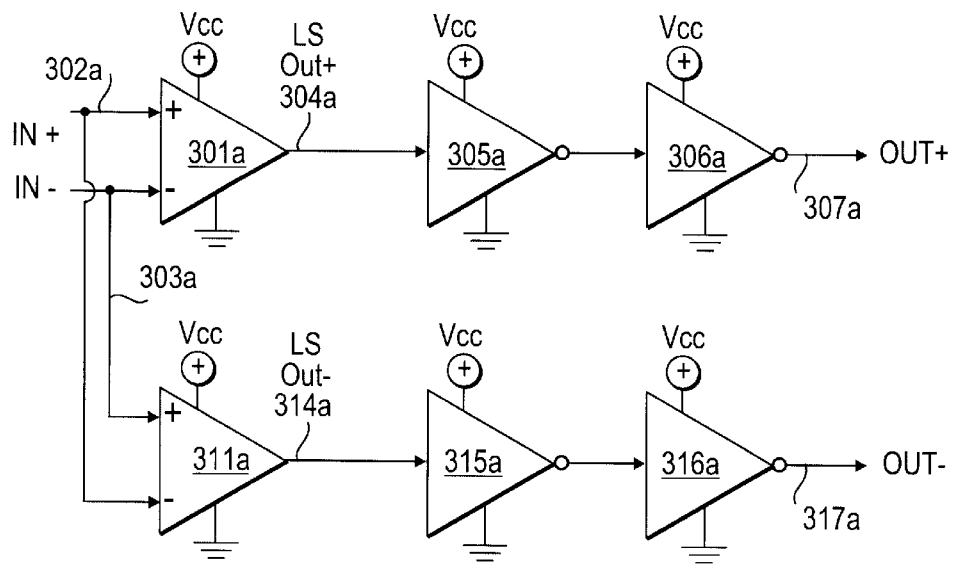
Figure 3B:
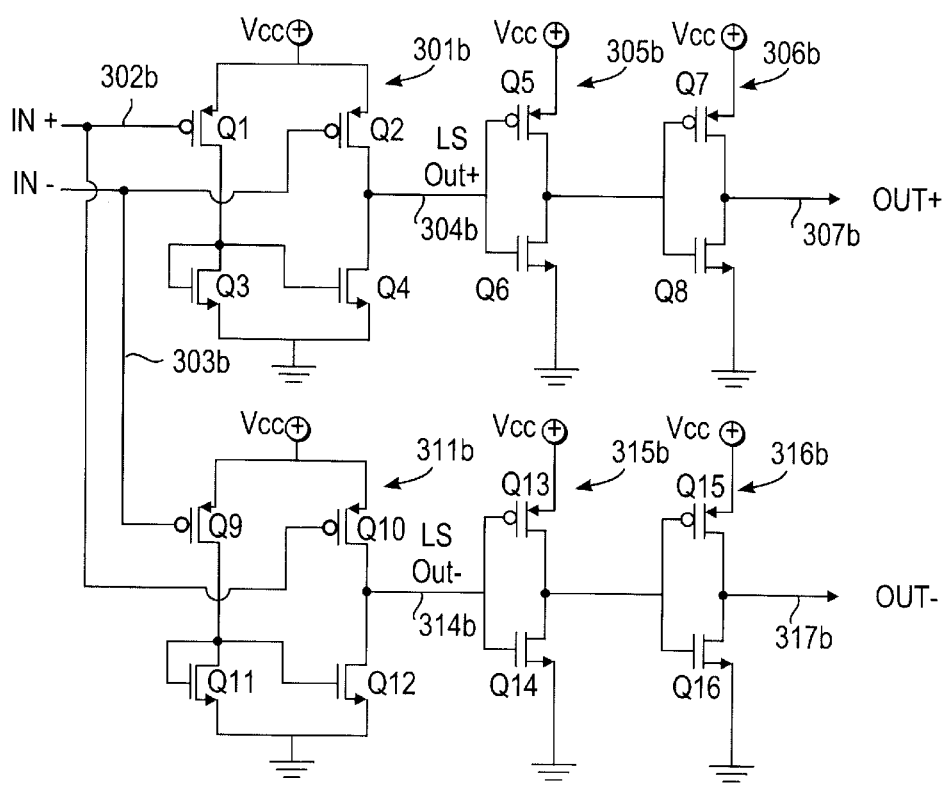
Figure 3C:
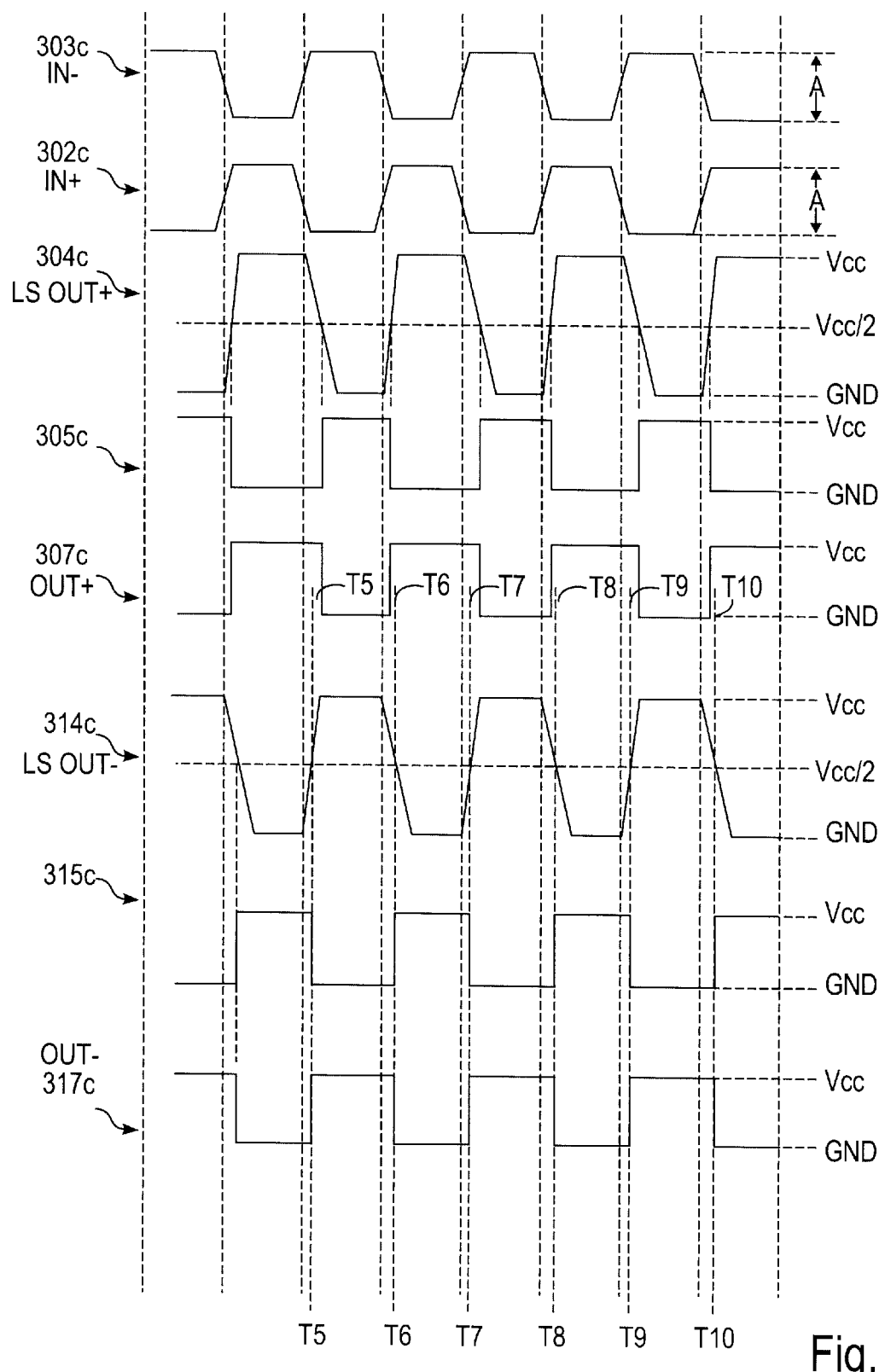
FIG. 3c shows exemplary input and output signal waveforms for the level shifting embodiment of FIG. 3b.

As described in the background, problems may arise if a signal having an asymmetry is processed or otherwise used. As such, additional circuitry may be added to the approach outlined in FIGS. 2a through 2c that help correct for the asymmetry. FIGS. 3a through 3c relate to a differential-to-differential level shifting approach that may be used, with some modification (as described in more detail with respect to FIGS. 4a through 4c), to correct for the level shifting asymmetries discussed so far.

A differential-to-differential level shifting approach accepts (as an input) a differential signal and provides (as an output) a differential, level shifted version of the input signal. FIG. 3a shows a differential-to-differential level shifting approach having rise and fall times that are comparable to the level shifting approach of FIG. 2a. FIG. 3b shows an embodiment of a transistor level design for the approach of FIG. 3a.

In one respect, the differential-to-differential level shifting approach of FIG. 3a may be viewed as a pair of differential-to-single ended circuits that each level shift one component of the differential input signal. That is, level shifter 301a and inverters 305a and 306a may be viewed as corresponding to level shifting circuitry for positive input IN+ 302a; and level shifter 311a and inverters 315a and 316a may be viewed as corresponding to level shifting circuitry for negative input IN− 303a. As such, referring to FIGS. 3a and 3c, the level shifter 301a output signal 304c LS OUT+ and the inverter 305a, 306a output signals 305c, 307c are similar to the level shifter 201a output signal 204c LS OUT and the inverter 205a, 206a output signals 205c, 207c of FIGS. 2a and 2c.

Furthermore, note that level shifter 311a may be viewed as corresponding to level shifter 301a with reversed inputs. As such, level shifter 311a "level shifts" the IN− input signal 303c whereas level shifter 301a "level shifts" the IN+ input signal 302c. Because IN− 302a,c is the logical inverse of IN+ 303a,c, the level shifter 311a output signal 314c LS OUT− and the inverter 315a, 316a output signals 315c, 317c may be viewed as corresponding to the logical inverse of, respectively: the level shifter 301a output signal 304c LS OUT+ and the inverter 305a, 306a output signals 305c, 307c.

Note, however, that the rise/fall time asymmetries observed within the level shifter 301a, 311a output signals 301c LS OUT+, 311c LS OUT− not only cause duty cycle distortion but also cause rise/fall time misalignment as between the 307c OUT+ signal and the 317c OUT− signal. That is, both output signals 307c OUT+ and 317c OUT− posses duty cycle distortion (as discussed above with respect to signal 207c OUT of FIG. 2c).

Furthermore, the rise times T5, T7, T9 of the OUT− signal 317c are not aligned with the fall times of the OUT+ signal 307c; and, similarly, the fall times T6, T8, T10 of the OUT− signal 317c are not aligned with the rise times of the OUT+ signal 307c. The misalignment of the rise/fall times results from the logically inverted relationship that level shifter 301a performs with respect to level shifter 311a (combined with the rise and fall time asymmetry that exists in the LS OUT+ signal 304c and the LS OUT− signal 314c).

That is, an LS OUT+ signal 304c rise time and an LS OUT− signal 314c fall time both correspond to the transition from a logical low to a logical high. As these transitions occur at different rates (because the LS OUT+ signal 304c rise time is less than the LS OUT− signal 314c fall time), they cross the Vcc/2 threshold at different times. The crossing of the Vcc/2 threshold at different times results directly in the rise/fall time misalignment just described. An analogous situation exists with respect to the LS OUT+ signal 304c fall time and the LS OUT− signal 314c rise time.

Figure 4A:
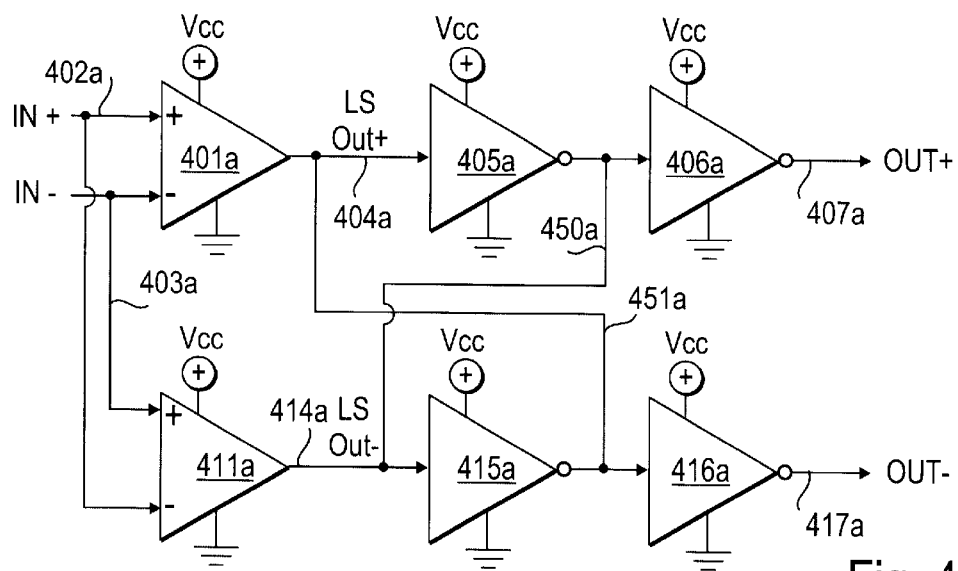
Figure 4B:
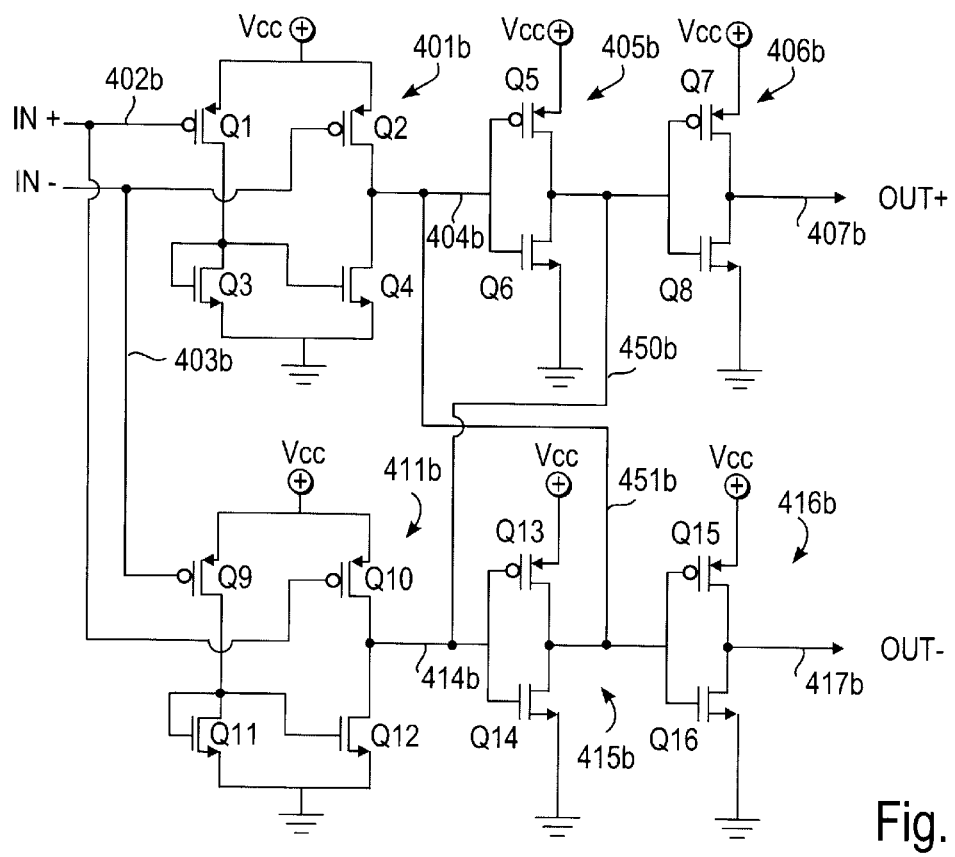
Figure 4C:
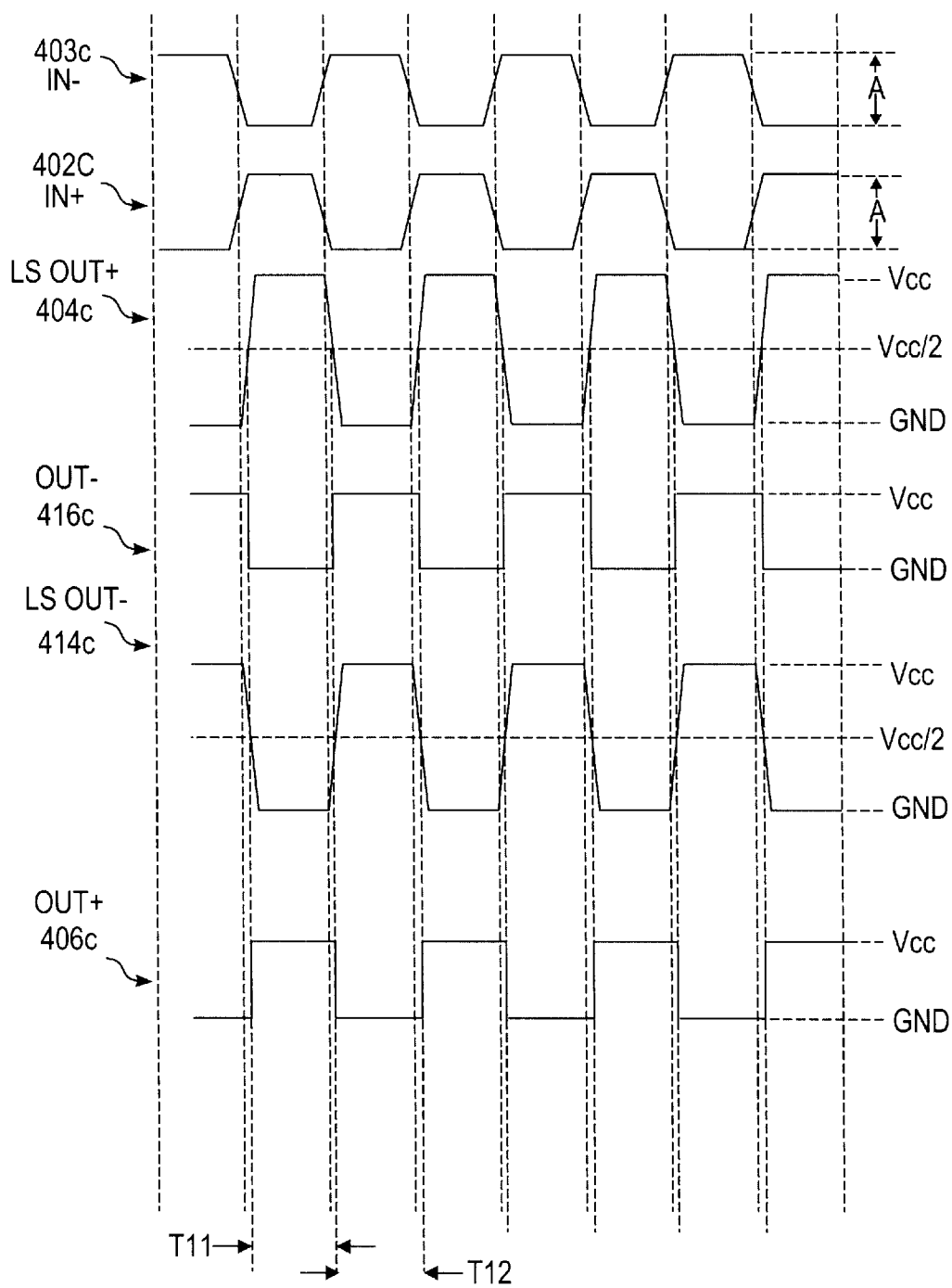
FIG. 4c shows exemplary input and output signal waveforms for the level shifting embodiment of FIG. 4b.

The duty cycle distortion of the OUT+ 307c and OUT− 317c signals, as well as the misalignment of their rise/fall times, may be viewed (once again) as asymmetries that should be corrected for. FIGS. 4a through 4c correspond to a differential-to-differential level shifting approach having less duty cycle distortion and rise/fall time misalignment than the level shifting approach just discussed with respect to FIGS. 3a through 3c.

Note that the approach of FIG. 4a corresponds to the approach of FIG. 3a having a pair of cross coupling lines 450a, 451a. That is, cross coupling line 450a couples the output 414a of the level shifter 411a that "level shifts" the IN− input 403a,c to the input of the inverter 406a that provides the OUT+ output signal 407a. Similarly, cross coupling line 451a couples the output 404a of the level shifter 401a that "level shifts" the IN+ input 402a,c to the input of the inverter 416a that provides the OUT− output signal 417a.

The cross coupling lines 450a, 451a effectively eliminate (or at least reduce) the duty cycle distortion and rise/fall time misalignments described above with respect to the approach of FIGS. 3a through 3c. That is, referring to FIG. 4c, note that the OUT+ signal 407c and the OUT− signal 417c each have an approximately 50—50 duty cycle (i.e., width T11 is about the same as width T12); and, the rise times of the OUT+ signal 407c occur at approximately the same time as the fall times of the OUT− signal 417c (and, the fall times of the OUT+ signal 407c occur at approximately the same time as the rise times of the OUT− signal 417c).

The cross coupling lines 450a, 451a allow the asymmetrical rise time and fall time associated with the output signal of each level shifter 401a, 411a to effectively correct for itself. That is, symmetrical rise and fall times are formed at each level shifter output LS OUT+ 404a,c and LS OUT− 414a,c. Referring briefly back to FIGS. 3a and 3c, recall that the LS OUT+ 304a,c signal has a slow fall time from a logical high to a logical low; and that, the LS OUT− 314a,c signal has a slow fall time from a logical low to a logical high.

With respect to the approach of FIGS. 4a through 4c, in a sense, because a signal processing path exists from the level shifter 411a output LS OUT− 414a to the OUT+ node 407a (via inverter 405a and coupling line 450a) and because a signal processing path exists from the level shifter 401a output LS OUT+ 404a to the OUT− node 417a (via inverter 415a and coupling line 451a), the circuitry of FIG. 4a processes the differential input signal as cooperative whole rather than (as with the circuitry of FIG. 3a) individually process different components of the differential input signal in an isolated fashion. This results in the small rise times and long fall times normally associated with the level shifter output signals automatically offsetting one another.

That is, via cross coupling signal lines 450a and 451a, the "faster" rise time of level shifter 411a (associated with the transition from a logical high to a logical low) acts to quicken the "slower" fall time of the LS OUT+ 404a,c signal; and, the "faster" rise time of level shifter 401a (associated with the transition from a logical low to a logical high) acts to quicken the "slower" fall time of the LS OUT− 414a,c signal. As such, the circuit operates in a balanced fashion that produces balanced output signals OUT+ 407c, OUT− 417c as represented by their 50—50 duty cycle and their aligned rise/fall times with respect to one another.

FIG. 4b represents a transistor level embodiment for the approach presented in FIG. 4a. In order to enhance the balancing described above, the PMOS transistors Q1, Q2, Q5, Q7, Q9, Q10, Q13, Q15 may be designed with larger gate widths (as compared to their corresponding NMOS transistors Q3, Q4, Q6, Q8, Q11, Q12, Q14, Q16) so that push/pull transistor pairs (e.g., Q1 and Q3, Q2 and Q4, etc.) have approximately equal gain with respect to each other.

It is important to point out that, because level shifting circuits are varied and well known in the art, other level shifter transistor level designs may be substituted for those illustrated in the Figures and discussed above. Furthermore, level shifters may be rail-to-rail or non rail-to-rail; and, the rail voltages may vary from embodiment. For example, in one embodiment a first rail may be a positive voltage and the second rail may be a negative voltage; and, in other embodiments a first rail may be a ground reference and a second rail may be fixed at either a positive or negative voltage.

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behaviorial level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
   a) a first level shifter that receives a differential input signal and a second level shifter that receives said differential input signal;
   b) a first inverter having an input coupled to an output of said first level shifter and a second inverter having an input coupled to an output of said second level shifter, wherein said first level shifter output provides a first signal that corresponds to the logical inverse of a second signal provided at said second level shifter output; and
   c) a third inverter having an input coupled to an output of said first inverter and a fourth inverter having an input coupled to an output of said second inverter, said first inverter output coupled to said second level shifter output and said second inverter output coupled to said first level shifter output.

2. The apparatus of claim 1 wherein said first level shifter is a rail-to-rail level shifter.

3. The apparatus of claim 2 wherein said second level shifter is a rail-to-rail level shifter.

4. The apparatus of claim 1 wherein said first inverter further comprises a PMOS transistor that is coupled to an NMOS transistor at said first invertor output, said NMOS and PMOS transistors designed to have the same gain.

5. The apparatus of claim 1 wherein said first level shifter further comprises a first transistor that couples a first voltage to said first level shifter output in response to a first component of said differential input signal wherein said first transistor receives said first component of said differential input signal, said first level shifter further comprising a second transistor that couples a second voltage to said first level shifter output in response to a second component of said differential input signal, said second component of said differential input signal received by a third transistor that drives a current through a fourth transistor in order to generate a third voltage in response to said second component of said differential input signal, said third voltage received by said second transistor.

6. The apparatus of claim 5 wherein said second level shifter further comprises a fifth transistor that couples said first voltage to said second level shifter output in response to said second component of said differential input signal wherein said fifth transistor receives said second component of said differential input signal, said second level shifter further comprising a sixth transistor that couples said second voltage to said second level shifter output in response to said first component of said differential input signal, said first component of said differential input signal received by a seventh transistor that drives a current through an eighth transistor in order to generate a fourth voltage in response to said first component of said differential input signal, said fourth voltage received by said sixth transistor.

7. An apparatus, comprising:
   a) first level shifter having a first transistor that couples a first voltage to an output of said first level shifter in response to a first component of a differential input signal wherein said first transistor receives said first component of said differential input signal, said first level shifter further comprising a second transistor that couples a second voltage to said first level shifter output in response to a second component of said differential input signal, said second component of said differential input signal received by a third transistor that drives a current through a fourth transistor in order to generate a third voltage in response to said second component of said differential input signal, said third voltage received by said second transistor;
   b) a second level shifter having a fifth transistor that couples said first voltage to an output of said second level shifter in response to said second component of said differential input signal wherein said fifth transistor receives said second component of said differential input signal, said second level shifter further comprising a sixth transistor that couples said second voltage to said second level shifter output in response to said first component of said differential input signal, said first component of said differential input signal received by a seventh transistor that drives a current through an eighth transistor in order to generate a fourth voltage in response to said first component of said differential input signal, said fourth voltage received by said sixth transistor;
   c) a first inverter having an input coupled to said first level shifter output and a second inverter having an input coupled to said second level shifter output, wherein said first level shifter output provides a first signal that corresponds to the logical inverse of a second signal provided at said second level shifter output; and
   d) a third inverter having an input coupled to an output of said first inverter and a fourth inverter having an input coupled to an output of said second inverter, said first inverter output coupled to said second level shifter output and said second inverter output coupled to said first level shifter output.

8. The apparatus of claim 7 wherein said first level shifter is a rail-to-rail level shifter.

9. The apparatus of claim 8 wherein said second level shifter is a rail-to-rail level shifter.

10. The apparatus of claim 8 wherein one of said rails is a ground reference.

11. The apparatus of claim 7 wherein said first inverter further comprises a PMOS transistor that is coupled to an NMOS transistor at said first invertor output, said NMOS and PMOS transistors designed to have the same gain.

12. A method, comprising:
    level shifting a differential signal to produce a first signal and level shifting the logical inverse of said differential signal to produce a second signal that is the logical inverse of said first signal;
    inverting said first signal to produce an inverted first signal and inverting said second signal to produce an inverted second signal; and
    inverting said first signal and said inverted second signal together, and, inverting said second signal and said inverted first signal together.

13. The method of claim 12 wherein said level shifting a differential signal further comprises rail-to-rail level shifting.

14. The method of claim 13 wherein level shifting the logical inverse of said differential signal further comprises said rail-to-rail level shifting.

* * * * *